(12) United States Patent
Morigaki

(10) Patent No.: US 6,238,841 B1
(45) Date of Patent: May 29, 2001

(54) PHOTOSENSITIVE RESIN COMPOSITION AND PHOTORESIST INK FOR MANUFACTURING PRINTED WIRING BOARDS

(75) Inventor: Toshio Morigaki, Kyoto (JP)

(73) Assignee: Goo Chemical Co., Ltd., Uji (JP)

( * ) Notice: Subject to any disclaimer, the term of this patent is extended or adjusted under 35 U.S.C. 154(b) by 0 days.

(21) Appl. No.: 09/310,191

(22) Filed: May 12, 1999

(30) Foreign Application Priority Data

May 12, 1998 (JP) .................................................. 10-128760

(51) Int. Cl.[7] .............................. G03F 7/038; G03F 7/30; G03F 7/38; G03F 7/40
(52) U.S. Cl. ...................... 430/280.1; 430/325; 430/311; 430/330; 522/84
(58) Field of Search .............................. 430/280.1, 311, 430/325, 330; 522/84

(56) References Cited

U.S. PATENT DOCUMENTS

| | | | |
|---|---|---|---|
| 4,001,016 | * | 1/1977 | Rosenkranz et al. .................. 96/35.1 |
| 4,025,348 | * | 5/1977 | Tsukada et al. .................... 430/280.1 |
| 4,272,620 | | 6/1981 | Ichimura ................................. 525/61 |
| 4,564,580 | | 1/1986 | Ichimura ............................... 430/281 |
| 4,610,952 | * | 9/1986 | Crivello ................................ 430/325 |
| 5,556,735 | * | 9/1996 | Ivory et al. ........................... 430/311 |

FOREIGN PATENT DOCUMENTS

| | | |
|---|---|---|
| 0 747 770 A2 | 12/1996 | (EP) . |
| 0 779 553 A1 | 6/1997 | (EP) . |
| 49-5923 | 2/1974 | (JP) . |
| 55-23163 | 2/1980 | (JP) . |
| 55-62905 | 5/1980 | (JP) . |
| 56-11906 | 2/1981 | (JP) . |
| 61-243869 | 10/1986 | (JP) . |
| 62-267302 | 11/1987 | (JP) . |
| 2-173747 | 7/1990 | (JP) . |
| 7-72624 | 3/1995 | (JP) . |
| 9-235348 | 9/1997 | (JP) . |

* cited by examiner

Primary Examiner—Cynthia Hamilton
(74) Attorney, Agent, or Firm—Arent Fox Kintner Plotkin & Kahn, PLLC

(57) ABSTRACT

A photosensitive resin composition having photocurability, thermosetting property, and developability with water or a diluted alkali aqueous solution, includes the following components (A) to (E). That is, the component (A) is a water-soluble photosensitive resin selected from the group consisting of a first resin obtained by introducing a styryl pyridinium group into a polyvinyl alcohol polymer, a second resin obtained by introducing a styryl quinolinium group into the polyvinyl alcohol polymer, and a third resin obtained by adding N-alkylol (meth) acrylamide to the polyvinyl alcohol polymer. The component (B) is a photosensitive prepolymer having carboxyl group and at least two ethylenically unsaturated groups in molecule. The component (C) is an epoxy compound having at least two epoxy groups in one molecule. The component (D) is a photopolymerization initiator. The component (E) is water. This photosensitive resin composition will be preferably used as a photoresist ink for manufacturing printed wiring boards such as a solder resist ink and a marking ink, developable-type ink for manufacturing color-filter pixels, or an ink for manufacturing color-filter protective films.

16 Claims, No Drawings

PHOTOSENSITIVE RESIN COMPOSITION AND PHOTORESIST INK FOR MANUFACTURING PRINTED WIRING BOARDS

BACKGROUND OF THE INVENTION

1. Field of the Invention

The present invention relates to a photosensitive resin composition having photocurability, thermosetting property, and developability with water or a diluted alkali aqueous solution, which can be preferably used as a photosolder resist ink to manufacture printed wiring boards.

2. Disclosure of the Prior Art

In the past, the screen-printing method has been mainly utilized to form solder resist films on printed wiring boards. However, as excellent resolution and tightly restricted dimensional tolerances are needed in recent years, the demand for liquid-type photosolder resist inks increases in place of the screen-printing method. For example, as disclosed in Japanese Patent Early Publication No. 61-243869, No. 2-173747, No. 7-72624, or No. 9-235348, there is a photo solder resist ink including a polyfunctional epoxy compound and an ultraviolet-curable resin obtained by adding an unsaturated group and carboxyl group to a novolac-type epoxy resin or an acrylic copolymer, which is developable with a diluted alkali aqueous solution.

However, in this kind of photoresist ink, ink components are dissolved or dispersed in an organic solvent to uniformly apply the ink components on a substrate. Therefore, it is generally required to evaporate the organic solvent from the photoresist ink by predrying prior to the subsequent exposure step. Thus, when using such a photoresist ink, there are problems inherent in the use of organic solvent, for example, a poor working condition, environmental pollution and the occurrence of a fire.

SUMMARY OF THE INVENTION

The present invention concerns a photosensitive resin composition having photocurability, thermosetting property, developability with water or a diluted alkali aqueous solution, which is capable of improving the above problems. The photosensitive resin composition of the present invention contains the following components (A) to (E). That is, the component (A) is a water-soluble photosensitive resin selected from the group consisting of a first resin obtained by introducing a styryl pyridinium group into a polyvinyl alcohol polymer, a second resin obtained by introducing a styryl quinolinium group into the polyvinyl alcohol polymer, and a third resin obtained by adding N-alkylol (meth) acrylamide to the polyvinyl alcohol polymer. The component (B) is a photosensitive prepolymer having carboxyl group and at least two ethylenically unsaturated groups in molecule. The component (C) is an epoxy compound having at least two epoxy groups in one molecule. The component (D) is a photopolymerization initiator. The component (E) is water.

It is preferred that the photosensitive resin composition further contains a photopolymerizable ethylenically-unsaturated monomer as the component (F).

It is particularly preferred to use the photosensitive resin composition of the present invention as a photo solder resist ink to manufacture printed wiring boards.

These and still other objects and advantages will become apparent from the following detail description of the preferred embodiments and examples of the invention.

DETAIL DESCRIPTION OF THE PREFERRED EMBODIMENTS

In the present specification, "(meth) acrylic-" means "acrylic-" and "methacrylic-". For example, (meth) acrylic acid means acrylic acid and methacrylic acid. In addition, (meth) acrylamide means acrylamide and methacrylamide.

A photosensitive resin composition of the present invention comprises a water-soluble photosensitive resin (A), photosensitive prepolymer (B), epoxy compound (C), photopolymerization initiator (D) and water (E).

The water-soluble photosensitive resin (A) is selected from the group consisting of a water-soluble photosensitive resin (A1) obtained by introducing a styryl pyridinium group or a styryl quinolinium group into a polyvinyl alcohol polymer, and a water-soluble photosensitive resin (A2) obtained by adding N-alkylol (meth) acrylamide to the polyvinyl alcohol polymer.

As the polyvinyl alcohol polymer used to prepare the photosensitive resin (A), for example, it is possible to use a polyvinyl alcohol obtained by complete saponification or a partial saponification of polyvinyl acetate, or a water-soluble polyvinyl alcohol derivative obtained by a reaction of —OH group or —OCOCH$_3$ group of a completely-saponified or partially-saponified polyvinyl alcohol with a compound such as an acid-anhydride containing compound, carboxy-group containing compound, epoxy-group containing compound, or an aldehyde-group containing compound. In addition, it is possible to use a vinyl alcohol copolymer having vinyl alcohol unit, which is obtained by the complete saponification or the partial saponification of polyvinyl acetate. As the copolymer component of vinyl acetate, for example, it is possible to use (meth) acrylic acid, (meth) acrylamide, N-methylol (meth) acrylamide, styrene, ethylene, propylene, maleic anhydride, (meth) acrylonitrile, (meth) acrylic ester.

It is preferred that the polyvinyl alcohol polymer contains 60 mol % or more of the vinyl alcohol unit within the polymerization unit. In particular, when using the polyvinyl alcohol polymer containing 80 mol % or more of the vinyl alcohol unit, or the polyvinyl alcohol obtained by the complete saponification of polyvinyl acetate, there is an advantage that the photosensitive resin composition of the present invention is excellent in the water-solubility.

The photosensitive resin (A1) can be prepared by a conventional method disclosed in, for example, Japanese Patent Early Publication [KOKAI] No. 55-23163, No. 55-62905, or No. 56-11906.

Concretely, for example, the photosensitive resin (A1) can be obtained by adding a formyl styryl pyridinium salt or a formyl styryl quinolinium salt to the polyvinyl alcohol polymer according to an acetal reaction applying alcoholic —OH group of the polyvinyl alcohol polymer.

The general formula (1) shows a typical structure of an introduced portion of the styryl pyridinium group in the photosensitive resin (A1).

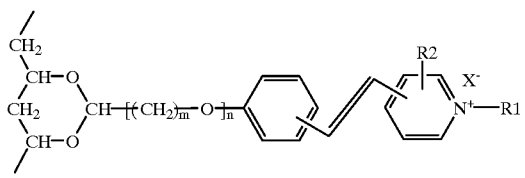

The general formula (2) shows a typical structure of an introduced portion of the styryl quinolinium group in the photosensitive resin (A1).

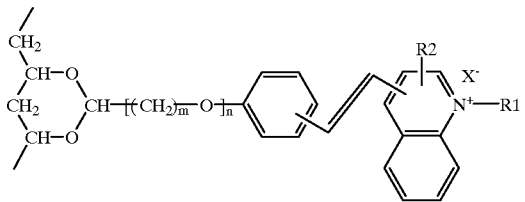

In these formulas (1) and (2), each of R1 and R2 is hydrogen atom, alkyl group, or aralkyl group, "X$^-$" is a conjugate base of an acid, "m" is an integer of 1~6, and "n" is 0 or 1.

It is preferred that an introduction rate of the styryl pyridinium group or the styryl quinolinium group in the photosensitive resin (A1) is within a range of 0.3 to 20 mol %, and more preferably 0.5 to 10 mol %, per vinyl alcohol polymerization unit constructing the photosensitive resin (A1). In the range of 0.3 to 20 mol % of the introduction rate, the photosensitive resin (A1) is good in the water-solubility, and provides a sufficient photo-bridging capability.

The water-soluble photosensitive resin (A2) can be prepared by a conventional method disclosed in, for example, Japanese Patent Publication [KOKOKU] No. 49-5923, or Japanese Patent Early Publication [KOKAI] No. 62-267302.

Concretely, for example, the photosensitive resin (A2) can be obtained by an etherification reaction between a polyvinyl alcohol polymer and N-alkylol (meth) acrylamide in the presence of an acid catalyst such as an inorganic acid or a sulfonic acid derivative in a solution of a good solvent for the polyvinyl alcohol polymer such as water or N-methyl pyrrolidone, or a suspension of a bad solvent for the polyvinyl alcohol polymer.

As the N-alkylol (meth) acrylamide, for example, it is possible to use N-methylol (meth) acrylamide, N-ethylol (meth) acrylamide, N-propylol (meth) acrylamide, or N-butylol (meth) acrylamide. When the N-alkylol (meth) acrylamide listed above is added to the polyvinyl alcohol polymer, it can be one of these compounds or a combination of two or more of these compounds, if necessary.

It is preferred that the addition ratio of the N-alkylol (meth) acrylamide is within a range of 0.05 to 25 mol %, and more preferably 0.05 to 15 mol %, per vinyl alcohol polymerization unit constructing the photosensitive resin (A2). In the above range of the addition ratio, good water-solubility and photo-curability of the photosensitive resin (A2) can be obtained.

The photosensitive prepolymer (B) is a photosensitive prepolymer having carboxyl group and at least two ethylenically unsaturated groups in molecule. The photosensitive prepolymer is characterized in that a plurality of groups having photopolymerizable ethylenically-unsaturated groups branch from a main chain of the prepolymer. Since the photosensitive prepolymer contains carboxyl group, it can be swelled, dispersed or dissolved in a diluted alkali aqueous solution. However, when the photosensitive prepolymer is exposed in the presence of the photopolymerization initiator, the ethylenically unsaturated groups of the prepolymer molecules react each other to increase the molecular weight, so that the dispersing property and the solubility to the diluted alkali aqueous solution lower.

Therefore, a film made of the photosensitive resin composition of the present invention containing the photosensitive prepolymer (B) can be swelled, dispersed or dissolved in the diluted alkali aqueous solution before the exposing step. However, after the film is cured by the exposing step according to photopolymerization, the dispersing property and the solubility to the diluted alkali aqueous solution lower. Therefore, by applying a difference of the solubility of the photosensitive resin composition to the diluted alkali aqueous solution between before and after the exposing step, it is possible to form a desired pattern of the cured film of the photosensitive resin composition. That is, the film of the photosensitive resin composition is selectively exposed, and then developed with the diluted alkali aqueous solution. The non-exposed region of the film is washed away to leave the exposed region of the film, so that the desired pattern of the cured film of the photosensitive resin composition is obtained.

It is preferred that the photosensitive prepolymer (B) itself can form a film. In the present invention, since the photosensitive resin composition contains the photosensitive resin (A) and the photosensitive prepolymer (B), there is an advantage that a predried film of the photosensitive resin composition is substantially free from surface tackiness, so that contamination of a phototool artwork with the photosensitive resin composition can be prevented even when the artwork is directly put on the predried film.

It is preferred that an acid value of the photosensitive prepolymer (B) is within a range of 20 to 300 mgKOH/g, and more preferably 40 to 200 mgKOH/g. In this range of the acid value, it is possible to shorten the developing time when developing the photosensitive resin composition with the diluted alkali aqueous solution. In addition, since the resistance of the cured film of the photosensitive resin composition to diluted alkali aqueous solution adequately lowers, a good pattern of the cured film can be easily formed.

It is also preferred that a weight-average molecular weight of the photosensitive prepolymer (B) is within a range of 2000 to 250000, and more preferably 4000 to 100000. In the above range of weight-average molecular weight, it is possible to stably obtain a sufficient photosensitivity of the photosensitive resin composition. In addition, when the weight-average molecular weight is less than 2000, there is a possibility that the surface tackiness of the predried film becomes significant. On the other hand, as the weight-average molecular weight exceeds 250000, there is a tendency of lowering the developing property.

Carboxyl group of the prepolymer (B) may be neutralized by an organic basic compound such as alkanol amine, alkali-metal hydroxide, or an inorganic basic compound such as ammonia.

As the prepolymer (B), for example, it is possible to use a photosensitive prepolymer (B1) obtained by adding an ethylenically unsaturated monocarboxylic acid and an unsaturated or saturated polybasic acid anhydride to a polyfunctional epoxy compound having at least two epoxy groups.

As the polyfunctional epoxy compound of the prepolymer (B1), for example, it is possible to use a phenol novolac-type epoxy resin, cresol novolac-type epoxy resin, bisphenol A-type epoxy resin, bisphenol A-novolac-type epoxy resin, bisphenol F-type epoxy resin, N-glycidyl-type epoxy resin, alicyclic-type epoxy resin (e.g., "EHPE-3150" manufactured by Daicel Chemical Industries, Ltd.), tris (hydroxyphenyl) methane-based polyfunctional epoxy resin (e.g., "EPPN-502H" manufactured by NIPPON KAYAKU Co., LTD. or "TACTIX-742" and "XD-905" manufactured by DOW CHEMICAL), dicyclopentadiene-phenol-type epoxy resin, naphthalene-type epoxy resin. As the ethylenically unsaturated monocarboxylic acid, for example, it is possible to use (meth) acrylic acid.

As the unsaturated or saturated polybasic acid anhydride of the prepolymer (B1), for example, it is possible to use a dibasic acid anhydride such as succinic anhydride, methyl succinic anhydride, maleic anhydride, citraconic anhydride, glutaric anhydride, itaconic anhydride, phthalic anhydride, tetrahydrophthalic anhydride, methyl tetrahydrophthalic anhydride, methyl nadic acid anhydride, hexahydrophthalic anhydride, and methyl hexahydrophthalic anhydride, or a polybasic acid anhydride such as trimellitic acid anhydride, pyromellitic acid anhydride, benzophenone tetracarboxylic anhydride and methyl cyclohexene tetracarboxylic anhydride.

In addition, as the prepolymer (B), it is possible to use a photosensitive prepolymer (B2) obtained by a reaction of a compound having a single photoreactive ethylenically unsaturated group and only one hydroxyl group in molecule with a copolymer of an unsaturated polybasic acid anhydride such as maleic anhydride and an aromatic hydrocarbon having vinyl group such as styrene, or a vinyl alkyl ether.

As the compound of the prepolymer (B2), for example, it is possible to use 2-hydroxyethyl (meth) acrylate, 2-hydroxypropyl (meth) acrylate, 2-hydroxybutyl (meth) acrylate, diethylene glycol mono (meth) acrylate, dipropylene glycol mono (meth) acrylate, or dibutylene glycol mono (meth) acrylate.

Moreover, as the prepolymer (B), for example, it is possible to use a photosensitive prepolymer (B3) obtained by a reaction of an ethylenically unsaturated compound having only one epoxy group with a copolymer of a first ethylenically unsaturated monomer having no carboxyl group and a second ethylenically unsaturated monomer having carboxyl group.

As the first ethylenically unsaturated monomer, for example, it is possible to use a straight-chained or branch-chained alkyl (meth) acrylate, alicyclic (meth) acrylate (an unsaturated bonding may be contained in its ring.), ethylene glycol ester (meth) acrylate such as hydroxyethyl (meth) acrylate, methoxyethyl (meth) acrylate, propylene glycol (meth) acrylate, glycerol mono (meth) acrylate, aromatic (meth) acrylate such as benzyl (meth) acrylate, acrylamide compound such as (meth) acrylamide, N-methyl (meth) acrylamide, N-propyl (meth) acrylamide and diacetone (meth) acrylamide, vinyl pyrrolidone, acrylonitrile, vinyl acetate, styrene, α-methyl styrene, or vinyl ether.

As the second ethylenically unsaturated monomer, for example, it is possible to use (meth) acrylic acid, maleic acid, crotonic acid, or itaconic acid.

As the ethylenically unsaturated compound having only one epoxy group of the prepolymer (B3), for example, it is possible to use a glycidyl (meth) acrylate such as glycidyl (meth) acrylate and 2-methylglycidyl (meth) acrylate, or an epoxy cyclohexyl derivative of (meth) acrylic acid such as (3,4-epoxy cyclohexyl) methyl (meth) acrylate.

As the prepolymer (B), for example, it is also possible to use a photosensitive prepolymer (B4) obtained by a reaction of a polymer or a copolymer containing an ethylenically unsaturated monomer having epoxy group as polymerization unit with an unsaturated monocarboxylic acid and a saturated or unsaturated polybasic acid anhydride.

As the ethylenically unsaturated monomer having epoxy group of the prepolymer (B4), for example, it is possible to use the ethylenically unsaturated compound having only one epoxy group of the prepolymer (B3).

When using the copolymer containing the ethylenically unsaturated monomer, it is possible to use an unsaturated monomer polymerizable with the ethylenically unsaturated monomer having epoxy group. For example, the first ethylenically unsaturated monomer of the prepolymer (B3) may be used.

As the unsaturated monocarboxylic acid and the saturated or unsaturated polybasic acid anhydride of the prepolymer (B4), for example, it is possible to use those of the prepolymer (B1).

In addition, as the prepolymer (B), for example, it is possible to use a photosensitive prepolymer (B5) obtained by a reaction of parts of carboxyl groups in a cellulose derivative having carboxyl groups with a compound having only one epoxy group and at least one ethylenically unsaturated group.

For example, the prepolymer (B5) can be prepared by the following method. That is, the compound having only one epoxy group and at least one ethylenically unsaturated group is added to a hydrophilic solvent solution of the cellulose derivative in the presence of a polymerization inhibitor and a catalyst. The resultant is agitated and mixed to obtain a mixture. The mixture is kept at a reaction temperature of 60 to 150° C., and more preferably 80 to 120° C. to obtain the prepolymer (B5). As the polymerization inhibitor, it is possible to use hydroquinone or hydroquinone monomethyl ether. As the catalyst, it is possible to use a tertiary amine such as benzyl dimethyl amine and triethyl amine, a quaternary ammonium salt such as trimethyl benzyl ammonium chloride and methyl triethyl ammonium chloride, or triphenyl stibine.

As the cellulose derivative of the prepolymer (B5), for example, it is possible to use hydroxypropyl methylcellulose phthalate, hydroxypropyl methylcellulose acetate succinate, cellulose acetate hexahydrophthalate, hydroxypropyl methylcellulose acetate phthalate, or hydroxypropyl methylcellulose hexahydrophthalate.

As the compound having only one epoxy group and at least one ethylenically unsaturated group of the prepolymer (B5), for example, it is possible to use a glycidyl (meth) acrylate such as glycidyl (meth) acrylate and 2-methyl glycidyl (meth) acrylate, or an epoxy cyclohexyl derivative of (meth) acrylic acid such as (3,4-epoxy cyclohexyl) methyl (meth) acrylate.

An amount used of the compound having only one epoxy group and at least one ethylenically unsaturated group should be determined such that parts of carboxyl groups of the cellulose derivative remain in the prepolymer (B5).

In addition, as the prepolymer (B), for example, it is possible to use a photosensitive prepolymer (B6) obtained by a reaction of a compound having only one epoxy group and at least one ethylenically unsaturated group and a saturated or unsaturated polybasic acid anhydride with a cellulose derivative having carboxyl groups.

For example, the prepolymer (B6) can be prepared by the following method. That is, a reaction product is obtained by a reaction of all or parts of carboxyl groups of the cellulose derivative with the compound having only one epoxy group and a single ethylenically unsaturated group. Then, the saturated or unsaturated polybasic acid anhydride is added to the reaction product to obtain the prepolymer (B6).

Alternatively, the prepolymer (B6) can be prepared by the following method. That is, the compound having only one epoxy group and at least one ethylenically unsaturated group is added and mixed to a hydrophilic solvent solution of the cellulose derivative, which is inactive to the saturated or unsaturated polybasic acid anhydride, in the presence of a polymerization inhibitor and a catalyst. The resultant is agitated and mixed to obtain a mixture. The mixture is kept at a reaction temperature of 60 to 150° C., and more preferably 80 to 120° C. to obtain the prepolymer (B6). As the polymerization inhibitor, it is possible to use hydroquinone or hydroquinone monomethyl ether. As the catalyst, it is possible to use a tertiary amine such as benzyl dimethyl amine and triethyl amine, a quaternary ammonium salt such as trimethyl benzyl ammonium chloride and methyl triethyl ammonium chloride, or triphenyl stibine. Next, the addition reaction of the saturated or unsaturated polybasic acid anhydride can be performed according to a similar manner to the above.

As the cellulose derivative and the compound having only one epoxy group and at least one ethylenically unsaturated group of the prepolymer (B6), for example, it is possible to use those of the prepolymer (B5). As the saturated or unsaturated polybasic acid anhydride of the prepolymer (B6), for example, it is possible to use that of the prepolymer (B1).

A component (C) of the photosensitive resin composition of the present invention is an epoxy compound having at least two epoxy groups in one molecule. As the component (C), for example, it is possible to use a phenol novolac-type epoxy resin, cresol novolac-type epoxy resin, bisphenol A-type epoxy resin, bisphenol A-novolac-type epoxy resin, bisphenol F-type epoxy resin, triglycidyl isocyanurate, YX 4000 (manufactured by Yuka Shell Epoxy Kabushiki Kaisha), sorbitol polyglycidyl ether, N-glycidyl-type epoxy resin, alycyclic-type epoxy resin (e.g., "EHPE-3150" manufactured by Daicel Chemical Industries, Ltd.), polyol polyglycidyl ether compound, glycidyl ester compound, tris (hydroxyphenyl) methane-based polyfunctional epoxy resin (e.g., "EPPN-502H" manufactured by NIPPON KAYAKU Co., LTD. or "TACTIX-742" and "XD-9053" manufactured by DOW CHEMICAL), hydrogenated bisphenol A-type epoxy resin, dicyclopentadiene-phenol-type epoxy resin, naphthalene-type epoxy resin or a vinyl polymerized polymer having epoxy group such as polyglycidyl (meth) acrylate. These materials may be used either alone or as a mixture thereof. In particular, it is preferred to use triglycidyl isocyanurate, YX 4000, phenol novolac-type epoxy resin, cresol novolac-type epoxy resin, bisphenol A-type epoxy resin, or bisphenol A-novolac-type epoxy resin.

The epoxy compound (C) may be emulsified or dispersed in an aqueous solution in advance. Alternatively, the epoxy compound may be a self-emulsification type. By post-baking a film of the photosensitive resin composition including the component (C) after the exposure to light and development, the film exhibits excellent chemical resistance, resistance to solvent, acid resistance, resistance to electrochemical corrosion, and a high hardness.

As the photopolymerization initiator (D), for example, it is possible to use benzoin, alkyl ether of benzoin such as benzoin methyl ether, benzoin ethyl ether and benzoin isopropyl ether, acetophenone such as acetophenone, 2,2-dimethoxy-2-phenyl acetophenone, 2,2-diethoxy-2-phenyl acetophenone, 1,1-dichloro acetophenone, 1-hydroxy cyclohexyl phenyl ketone, and 4-(2-hydroxyethoxy) phenyl-(2-hydroxy-2-propyl) ketone, anthraquinone such as 2-methyl anthraquinone and 2-amyl anthraquinone, thioxanthone such as 2,4-dimethyl thioxanthone, 2,4-diethyl thioxanthone, 2-chloro thioxanthone, 2,4-diisopropyl thioxanthone and 1-chloro-4-propoxy thioxanthone, ketal such as acetophenone dimethyl ketal and benzyl dimethyl ketal, benzophenone such as 3,3-dimethyl-4-methoxy benzophenone, 3,3',4,4'-tetra-(tert-butyl peroxyl carbonyl) benzophenone and 4-benzoyl-4'-methyl diphenyl sulfido, nitrogen-containing compound such as 2-methyl-1-[4-(methylthio) phenyl]-2-morpholino-1-propane-1-on, 2-benzyl-2-dimethylamino-1-(4-morpholinophenyl)-butane-1-one, and 4,4'-bis-diethyl amino benzophenone, or 2,4,6-trimethyl benzoyl diphenyl phosphine oxide. The photopolymerization initiator can be one of these materials, or a combination of two or more of these materials, if necessary.

The photopolymerization initiator (D) may be used together with conventional photopolymerization enhancer and sensitizer such as a benzoic acid and a tertiary amine, e.g., p-dimethyl amino benzoic acid ethyl ester, p-dimethyl amino benzoic acid isoamyl ester, and 2-dimethyl amino ethyl benzoate.

As a first optional component, the photosensitive resin composition of the present invention can contain a photopolymerizable ethylenically unsaturated monomer (F). As the monomer (F), for example, it is possible to use trimethylol propane tri (meth) acrylate, pentaerythritol tri (meth) acrylate, pentaerythritol tetra (meth) acrylate, dipentaerythritol penta (meth) acrylate, dipentaerythritol hexa (meth) acrylate, 1,4-butanediol diacrylate, 1,6-hexane diol di (meth) acrylate, neopentyl glycol di (meth) acrylate, tripropylene glycol di (meth) acrylate, 2,2-bis[4-((meth) acryloxy ethoxy) phenyl] propane, 2,2-bis[4-((meth) acryloxy diethoxy) phenyl] propane, 2-hydroxy-1,3-di (meth) acryloxy propane, ethylene glycol di (meth) acrylate, diethylene glycol di (meth) acrylate, triethylene glycol di (meth) acrylate, phenoxy ethyl (meth) acrylate, phenoxy diethylene glycol (meth) acrylate, methoxy diethylene glycol (meth) acrylate, tetrahydro furfuryl (meth) acrylate, dicyclopentenyl hydroxy ethyl (meth) acrylate, 1-methoxy cyclododecadienyl (meth) acrylate, β-(meth) acryloyl hydroxy ethyl hydrogen phthalate, β-(meth) acryloyl hydroxy ethyl hydrogen succinate, 3-chloro-2-hydroxy propyl (meth) acrylate, lauryl (meth) acrylate, cetyl (meth) acrylate, stearyl (meth) acrylate, bisphenol A-diepoxy acrylic acid adduct, urethane (meth) acrylate, polyester (meth) acrylate, (meth) acrylamide, N-methoxy methyl (meth) acrylamide, N,N-dimethyl (meth) acrylamide, (meth) acryloyl morpholine, N-methylol (meth) acrylamide, hydroxy propyl (meth) acrylate, polyethylene glycol di (meth) acrylate, methylene bis (meth) acrylamide, 2-hydroxy ethyl (meth) acrylate,2,2-bis[4-methacryloyl hydroxy polyethoxy phenyl] propane. The monomer (F) can be one of these materials or a combination of two or more of these materials, if necessary.

As a second optional component, the photosensitive resin composition of the present invention can contain an organic solvent. An amount used of the organic solvent should be determined such that the problem inherent in the use of the organic solvent is ignorable. For example, as the organic solvent, it is possible to use an alcohol such as ethanol, propanol, 2-propanol, butanol, 2-butanol, hexanol, ethylene glycol, diethylene glycol, triethylene glycol, propylene glycol, dipropylene glycol, butylene glycol, trimethylol propane, neopentyl glycol, glycerin, 1,2,4-butanetriol, 1,2-butanediol, 1,4-butanediol and diacetone alcohol, ethylene glycol alkyl ether such as ethylene glycol monomethyl ether, ethylene glycol monoethyl ether and ethylene glycol monobutyl ether, polyethylene glycol alkyl ether such as diethylene glycol monomethyl ether, diethylene glycol monoethyl ether and triethylene glycol monomethyl ether, propylene glycol alkyl ether such as propylene glycol monomethyl ether, polypropylene glycol alkyl ether such as dipropylene glycol monomethyl ether, acetic ester such as ethylene glycol monomethyl ether acetate, diethylene glycol monomethyl ether acetate, propylene glycol monomethyl ether acetate, dipropylene glycol monomethyl ether acetate, glycerin monoacetate and glycerin diacetate, lactic ester such as ethyl lactate and butyl lactate, dialkyl glycol ether such as diethylene glycol diethyl ether, ketone such as methyl ethyl ketone, cyclohexanone and isophorone, aromatic hydrocarbon such as toluene and xylene, oil and aromatic-type mixed solvent such as "SWASOL SERIES" (manufactured by Maruzen Petrochemical Co., Ltd.) and "SOLVESSO SERIES" (manufactured by EXXON CHEMICAL COMPANY), n-hexane, cyclohexane, or tetrahydrofuran. The organic solvent can be one of these materials, or a combination of two or more of these materials, if necessary.

In addition to the above-explained components (A) to (E), the photosensitive resin composition of the present invention may include a blocked isocyanate such as tolylene diisocyanate, morpholine diisocyanate, isophorone diisocyanate, and hexamethylene diisocyanate, blocked with caprolactam, oxime or malonic ester, a thermosetting component of an amino resin, for example, n-butylated melamine resin, isobutylated melamine resin, butylated urea resin, butylated melamine urea co-condensation resin, and benzoguanamine co-condensation resin, an ultraviolet-curable epoxy (meth) acrylate obtained by adding acrylic acid or methacrylic acid to an epoxy resin such as bisphenol A-type epoxy resin, phenol novolac-type epoxy resin, cresol novolac-type epoxy resin and alicyclic epoxy resin, or a high molecular compound such as a diallyl phthalate resin, phenoxy resin, melamine resin, urethane resin, and a fluorine-contained resin. For example, several parts by weight of these compounds may be added to the photosensitive resin composition of the present invention.

To adjust the suitability for printing, the photosensitive resin composition of the present invention may also includes a leveling agent such as a fluorine surface-active agent, silicone and (meth) acrylate copolymer, a thixotropic agent, a polymerization inhibitor such as hydroquinone, hydroquinone monomethyl ether, pyrogallol, tert-butyl catechol and phenothiazine, monofunctional epoxy compound, antihalation agent, flame retardant, defoamer, anti-oxidant, pigment wetting agent, organic or inorganic pigment and dye, additives such as synthetic rubber powder and natural rubber powder, high molecular dispersing agent or surface-active agent for improving the dispersion stability.

It is preferred to prepare the photosensitive resin composition of the present invention according to the following compounding amounts of the water-soluble photosensitive resin (A), photosensitive prepolymer (B), epoxy compound (C), photopolymerization initiator (D) and water (E).

That is, it is preferred that the compounding amount of the water-soluble photosensitive resin (A) is 0.1 to 50 wt %, and more preferably 1 to 30 wt % with respect to the total amount of all components of the photosensitive resin composition except for water (E) and the organic solvent as the second optional component. In the above range, there are advantages that (1) the photosensitive resin composition is excellent in the water-solubility; (2) a film of the photosensitive resin composition cured by photopolymerization exhibits good water resistance; and (3) peeling of the cured film does not occur at the time of the formation of the cured film. In particular, when the compounding amount is 0.5 wt % or more, the photosensitive resin composition can be easily developed with water.

It is preferred that the compounding amount of the photosensitive prepolymer (B) is 10 wt % or more, and particularly 25 wt % or more with respect to the total amount of all components of the photosensitive resin composition except for water (E) and the organic solvent as the second optional component. All of the components included in the photosensitive resin composition of the present invention except for the water-soluble photosensitive resin (A), the epoxy compound (C), the photopolymerization initiator (D), water (E) and the organic solvent as the second optional component, may be the photosensitive prepolymer (B). In the above range, there is an advantage that a predried film of the photosensitive resin composition is almost free from the surface tackiness.

It is preferred that a compounding amount of the epoxy compound (C) is within a range of 0.1 to 50 wt % with respect to the total amount of the photo solder resist ink components except for water (E) and the organic solvent as the second optional component. When the compounding amount is less than 0.1 wt %, there is a possibility of lowering the solder resistance and the plating resistance of the cured film. When the compounding amount is more than 50 wt %, there is a possibility of lowering the developing property.

It is preferred that the compounding amount of the photopolymerization initiator (D) is within a range of 0.1 to 20 wt % with respect to the total amount of all components of the photosensitive resin composition except for water (E) and the organic solvent as the second optional component. In the above range, there is an advantage that the photosensitive resin composition is excellent in the photo-curability.

It is preferred that the compounding amount of water (E) is within a range of 10 to 97 wt % with respect to the total amount of all components of the photosensitive resin composition. In the above range, there is an advantage that the fluidity of the photosensitive resin composition is suitable to uniformly apply the resin composition on substrate.

When the photosensitive resin composition contains the ethylenically unsaturated monomer (F), it is preferred that the compounding amount of the monomer (F) is 75 wt % or less with respect to the total amount of all components of the photosensitive resin composition except for water (E) and the organic solvent as the second optional component. The monomer (F) is useful to more improve the photoreactivity of the photosensitive resin composition. When the compounding amount is more than 75 wt %, there is a possibility that the surface tackiness of the predried film of the photosensitive resin composition comes into problem.

There is no limitation as to a method of preparing the photosensitive resin composition of the present invention. For example, the components (A) to (D) and the other optional components may be dissolved, emulsified, and dispersed in water (E) or a mixture of water and an aqueous organic solvent to obtain the photosensitive resin composition. Alternatively, the components (B), (C), (D) and the other optional components may be added to an aqueous solution of the component (A), and then mixed to obtain the photosensitive resin composition. In these methods, it is preferred to use an agitator or a muller such as homomixer, pipeline homomixer, bead mill, roll mill and ball mill.

In addition, to prevent a reaction between the epoxy compound (C) and the photosensitive prepolymer (B) during storage, it is preferred to prepare the photosensitive resin composition of the present invention according to the following steps. That is, the photosensitive resin (A), photosensitive prepolymer (B), photopolymerization initiator (D) and water (E) are mixed to prepare a first mixture. The photosensitive resin (A), epoxy compound (C), and water (E) are mixed to prepare a second mixture. The first mixture is mixed with the second mixture immediately before the use to obtain the photosensitive resin composition of the present invention.

Next, a method of forming a required pattern on a substrate with the use of the photosensitive resin composition of the present invention is explained as an example.

<Applying Step>

First, the photosensitive resin composition is applied on a substrate by dipping, spraying, spin-coating, roll coating, curtain-flow coating, or screen printing. A copper clad laminate used to manufacture printed wiring boards may be used as the substrate.

<Predrying Step>

The photosensitive resin composition on the substrate is dried by hot-air heating, electromagnetic induction heating, hot-pressing, or far-infrared drying to obtain a predried film.

<Exposing Step>

After a mask having a required pattern such as a phototool artwork is directly or indirectly put on the predried film, ultraviolet is radiated to the predried film through the mask by using a tungsten lamp, chemical lamp, low-pressure mercury lamp, medium-pressure mercury lamp, high-pressure mercury lamp, extra-high-pressure mercury lamp, xenon lamp or a metalhalide lamp. Alternatively, it is preferred to adopt a laser patterning method using a helium-cadmium laser, argon laser or a YAG laser.

<Developing Step>

After the exposing step, the predried film is developed with water or a diluted alkali aqueous solution, so that the non-exposed region of the predried film is washed away to leave the exposed region of the predried film on the substrate as a resist pattern. When developing with the diluted alkali aqueous solution, it is preferred to use an aqueous solution of an alkali hydroxide such as sodium hydroxide, potassium hydroxide and lithium hydroxide, or an alkali carbonate such as sodium carbonate and potassium carbonate.

<Post-baking Step>

After the exposing and developing steps, the predried film is post-baked by hot-air heating, induction heating, hot pressing, or far-infrared drying. For example, when the epoxy compound is cured by heating at a temperature of 120 to 180° C. for 30 to 90 minutes, it is possible to obtain improved strength and hardness and excellent chemical resistance of the cured film.

In conclusion, the photosensitive resin composition of the present invention can provide the following advantages.

(1) Since the photosensitive resin composition does not essentially contain the organic solvent, it is possible to prevent the occurrence of the problem inherent in the use of organic solvent.

(2) The predried film of the photosensitive resin composition can be developed with water or a diluted alkali aqueous solution.

(3) By post-baking the film of the photosensitive resin composition including the component (C) after the developing step, it is possible to obtain improved chemical resistance, resistance to solvent, acid resistance, and resistance to electrochemical corrosion, and an increased hardness of the film.

The photosensitive resin composition of the present invention will be preferably used as a photoresist ink for manufacturing printed wiring boards such as a solder resist ink and a marking ink, developable-type ink for manufacturing color-filter pixels, or an ink for manufacturing color-filter protective films.

EXAMPLES AND COMPARATIVE EXAMPLES

The followings are preferred examples of the present invention. However, needless to say, the present invention is not limited to these examples. The units "parts" and "%" used in the examples mean "parts by weight" and "wt %", respectively. In addition, "weight-average molecular weight" was measured by a GPC (Gel Permeation Chromatography) method under the following condition.

[GPC Measuring Condition]

GPC Measuring Apparatus: SHODEX SYSTEM 11 manufactured by Showa Denko K.K.
Column: SHODEX KF-800P, KF-805, KF-803 and KF-801 in series
Transfer Layer: THF (Tetrahydrofuran)
Flow Rate: 1 ml/min.
Column Temperature: 45° C.
Detector: RI
Conversion: Polystyrene In the GPC measurement, a THF (tetrahydrofuran) solution having a concentration of 10 mg/ml with respect to the solid part of each sample was prepared, and the injection amount is 100 µl.

[Preparation of Photosensitive Resin Aqueous Solution (S-1)]

A first mixture was prepared by dissolving 200 g of a partially-saponified polyvinyl acetate "GOHSENOL GH-17" (manufactured by The Nippon Synthetic Chemical Industry Co., Ltd., Degree of polymerization: 1700, Degree of saponification: 88 mol %) in 1774 g of water. Then, a second mixture was prepared by adding 20 g of N-methyl-4-(p-formyl styryl) pyridinium methosulfate to the first mixture. In addition, a third mixture was prepared by adding 6 g of an 85% phosphoric acid aqueous solution to the second mixture. The third mixture was kept at 80° C. for 7 hours to obtain the photosensitive resin aqueous solution (S-1), which corresponds to an aqueous solution of the water-soluble photosensitive resin (A1).

[Preparation of Photosensitive Resin Aqueous Solution (S-2)]

A first mixture was prepared by dissolving 200 g of a partially-saponified polyvinyl acetate "PVA-224" (manufactured by Kuraray Co., Ltd., Degree of polymerization: 2400, Degree of saponification: 88 mol %) in 1774 g of water. A second mixture was prepared by adding 20 g of N-methyl-4-(p-formyl styryl) quinolinium methosulfate to the first mixture. A third mixture was prepared by adding 6 g of an 85% phosphoric acid aqueous solution to the second mixture. The third mixture was kept at 70° C. for 5 hours to obtain the photosensitive resin aqueous solution (S-2), which corresponds to an aqueous solution of the water-soluble photosensitive resin (A1).

[Preparation of Photosensitive Resin Aqueous Solution (S-3)]

A first mixture was prepared by dissolving 200 g of a partially-saponified polyvinyl acetate "GOHSENOL GH-17" (manufactured by The Nippon Synthetic Chemical Industry Co., Ltd., Degree of polymerization: 1700, Degree of saponification: 88 mol %) in 1000 g of water. A second mixture was prepared by dissolving 40 g of N-methylol acrylamide in the first mixture. A third mixture was prepared by adding 2 g of a 0.1% methoxy hydroquinone aqueous solution and 3 g of an 85% phosphoric acid aqueous solution to the second mixture. After the third mixture was kept at 60° C. for 20 hours, the third mixture was neutralized with a 5% caustic soda aqueous solution to obtain a fourth mixture. Water was also added to the fourth mixture such that the total weight is 1500 g, to thereby obtain the photosensitive resin aqueous solution (S-3), which corresponds to an aqueous solution of the water-soluble photosensitive resin (A2).

[Preparation of Photosensitive Resin Aqueous Solution (S-4)]

A first mixture was prepared by dissolving 200 g of a partially saponified of a vinyl acetate polymer-unsaturated carboxylic acid Na copolymer "KL318" (manufactured by Kuraray Co., Ltd., Degree of polymerization: 1800, Degree of saponification: 88 mol %) in 1000 g of water. A second mixture was prepared by dissolving 60 g of N-methylol acrylamide in the first mixture. Then, 2 g of a 0.1% methoxy hydroquinone aqueous solution and 3 g of an 85% phosphoric acid aqueous solution were added to the second mixture to obtain a third mixture. After the third mixture was kept at 80° C. for 5 hours, the third mixture was neutralized with a 5% caustic soda aqueous solution to obtain a fourth mixture. Water was also added to the fourth mixture such that the total weight is 1625 g to obtain the photosensitive resin aqueous solution (S-4), which corresponds to an aqueous solution of the water-soluble photosensitive resin (A2).

[Preparation of Photosensitive Prepolymer Solution (P-1)]

A first mixture was prepared by dissolving 214 parts of a cresol novolac-type epoxy resin "EPICLON N-680" (manufactured by DAINIPPON INK AND CHEMICALS INCORPORATED, Epoxy Equivalents: 214) in 60 parts of methyl ethyl ketone at a raised temperature. Next, 74 parts of acrylic acid, 0.1 parts of hydroquinone, and 2.0 parts of dimethyl benzylamine were added to the first mixture to obtain a second mixture. The second mixture was held at 80° C. for 24 hours to obtain a third mixture under airflow. After the third mixture was cooled, 136 parts of methyl ethyl ketone and 76 parts of tetrahydro phthalic anhydride were added to the third mixture to obtain a fourth mixture. The fourth mixture was kept at 80° C. for 10 hours while being agitated, to obtain a 65% photosensitive prepolymer solution (P-1), which corresponds to a solution of the photosensitive prepolymer (B1). The weight-average molecular weight and the acid value of the prepolymer solution (P-1) are 12000 and 77 mgKOH/g, respectively.

[Preparation of Photosensitive Prepolymer Solution (P-2)]

A first mixture was prepared by dissolving 150 parts of a styrene-maleic anhydride copolymer "SMA-1000A" (manufactured by ELF ATOCHEM JAPAN, INC.) in 149 parts of methyl ethyl ketone at a raised temperature. Next, 51 parts of 2-hydroxy ethyl acrylate, 0.1 parts of hydroquinone, and 3 part of dimethyl benzylamine were added to the first mixture to obtain a second mixture. After the second mixture was held at 80° C. for 12 hours to obtain a third mixture under airflow. A fourth mixture was prepared by adding 22 parts of n-butanol to the third mixture, and then held for 24 hours to obtain a 57% photosensitive prepolymer solution (P-2), which corresponds to a solution of the photosensitive prepolymer (B2). The weight-average molecular weight and the acid value of the prepolymer solution (P-2) are 7500 and 156 mgKOH/g, respectively.

[Preparation of Photosensitive Prepolymer Solution (P-3)]

20 parts of methacrylic acid, 80 parts of methyl methacrylate, 100 parts of methyl ethyl ketone, 0.5 parts of lauryl mercaptan and 4 parts of azobis isobutyronitrile were put in a four-mouth flask, and held at 75° C. for 5 hours at a raised temperature under a nitrogen flow to obtain a 50% copolymer solution. The four-mouth flask has a thermometer, glass tube for nitrogen substitution, agitator, and a reflux condenser. Next, a first mixture was prepared by adding 15 parts of glycidyl methacrylate, 0.05 parts of hydroquinone and 2.0 parts of dimethyl benzylamine to the copolymer solution, and then held at 80° C. for 24 hours under airflow. By adding 13 parts of methyl ethyl ketone to the first mixture, a 50% photosensitive prepolymer solution (P-3) was obtained, which corresponds to a solution of the photosensitive prepolymer (B3). The weight-average molecular weight and the acid value of the prepolymer solution (P-3) are 15000 and 62 mgKOH/g, respectively.

[Preparation of Photosensitive Prepolymer Solution (P-4)]

70 parts of glycidyl methacrylate, 10 parts of methyl methacrylate, 20 parts of tert-butyl methacrylate, 100 parts of methyl ethyl ketone, 0.5 parts of lauryl mercaptan and 3 parts of azobis isobutyronitrile were put in a four-mouth flask, and held at 75° C. for 5 hours at a raised temperature under a nitrogen flow to obtain a 50% copolymer solution. The four-mouth flask has a thermometer, glass tube for nitrogen substitution, agitator, and a reflux condenser. Next, a first mixture was prepared by adding 0.05 parts of hydroquinone, 37 parts of acrylic acid and 2.0 parts of dimethyl benzylamine to the copolymer solution, and held at 80° C. for 24 hours under airflow. Then, a second mixture was prepared by adding 38 parts of tetrahydrophthalic anhydride and 75 parts of methyl ethyl ketone to the first mixture, and held at 80° C. for 10 hours to obtain a 50% photosensitive prepolymer solution (P-4), which corresponds to a solution of the photosensitive prepolymer (B4). The weight-average molecular weight and the acid value of the prepolymer solution (P-4) are 22000 and 80 mgKOH/g, respectively.

[Preparation of Photosensitive Prepolymer Solution (P-5)]

30 parts of hydroxypropyl methylcellulose acetate succinate "AS-L" (manufactured by Shin-Etsu Chemical Co., Ltd.), 65 parts of methyl ethyl ketone, 0.05 parts of hydroquinone, 2.6 parts of glycidyl methacrylate and 2.0 parts of dimethyl benzylamine were put in a four-mouth flask having a thermometer, agitator, and a reflux condenser, and held at 80° C. for 24 hours to obtain a 35% photosensitive prepolymer solution (P-5), which corresponds to a solution of the photosensitive prepolymer (B5). The weight-average molecular weight and the acid value of the prepolymer solution (P-5) are 63500 and 47.5 mgKOH/g, respectively.

[Preparation of Photosensitive Prepolymer Solution (P-6)]

40 parts of hydroxypropyl methylcellulose acetate succinate "AS-L" (manufactured by Shin-Etsu Chemical Co., Ltd.), 100 parts of methyl ethyl ketone, 0.05 parts of hydroquinone, 8.7 parts of glycidyl methacrylate and 2.0 parts of dimethyl benzylamine were put in a four-mouth flask, and held at 80° C. for 24 hours to obtain a first mixture. The four-mouth flask has a thermometer, agitator, and a reflux condenser. Next, a second mixture was prepared by adding 9.3 parts of tetrahydrophthalic anhydride and 5.7 parts of methyl ethyl ketone to the first mixture, and held at 80° C. for 10 hours to obtain a 35% photosensitive prepolymer solution (P-6), which corresponds to a solution of the photosensitive prepolymer (B6). The weight-average molecular weight and the acid value of the prepolymer solution (P-6) are 200000 and 59 mgKOH/g, respectively.

[Preparation of Photosensitive Prepolymer Solution (P-7)]

A first mixture was prepared by dissolving 214 parts of a cresol novolac-type epoxy resin "EPICLON N-680" (manufactured by DAINIPPON INK AND CHEMICALS INCORPORATED, Epoxy Equivalents: 214) in 60 parts of carbitol acetate at a raised temperature. Next, 74 parts of acrylic acid, 0.1 parts of hydroquinone, and 0.7 parts of dimethyl benzylamine were added to the first mixture under airflow to obtain a second mixture. The second mixture was held at 100° C. for 24 hours to obtain a third mixture. After the third mixture was cooled, 128 parts of carbitol acetate and 61 parts of tetrahydrophthalic anhydride were added to the third mixture to obtain a fourth mixture. The fourth mixture was kept at 100° C. for 3 hours while being agitated, to obtain a 65% photosensitive prepolymer solution (P-7), which corresponds to a solution of the photosensitive prepolymer (B1). The weight-average molecular weight and the acid value of the prepolymer solution (P-7) are 12000 and 64 mgKOH/g, respectively.

[Preparation of Photosensitive Prepolymer Solution (P-8)]

A first mixture was prepared by dissolving 150 parts of a styrene-maleic anhydride copolymer "SMA-1000A" (manufactured by ELF ATOCHEM JAPAN, INC.) in 149 parts of propylene glycol monomethyl ether acetate at a raised temperature. Next, 51 parts of 2-hydroxyethyl acrylate, 0.1 parts of hydroquinone, and 1.0 parts of dimethyl benzylamine were added to the first mixture under airflow. The resultant was held at 100° C. for 12 hours to obtain a second mixture. In addition, a third mixture was prepared by adding 22 parts of n-butanol to the second mixture, and held for 24 hours to obtain a 57% photosensitive prepolymer solution (P-8), which corresponds to a solution of the photosensitive prepolymer (B2). The weight-average molecular weight and the acid value of the prepolymer solution (P-8) are 7500 and 156 mgKOH/g, respectively.

[Preparation of Photosensitive Prepolymer Solution (P-9)]

70 parts of glycidyl methacrylate, 30 parts of tert-butyl methacrylate, 100 parts of carbitol acetate, 0.3 parts of lauryl mercaptan and 3 parts of azobis isobutyronitrile were put in a four-mouth flask having a thermometer, glass tube for nitrogen substitution, agitator, and a reflux condenser, and held at 80° C. for 5 hours at a raised temperature under a nitrogen flow to obtain a 50% copolymer solution. Next, a first mixture was prepared by adding 0.05 parts of hydroquinone, 37 parts of acrylic acid and 0.4 parts of dimethyl benzylamine to the 50% copolymer solution, and held at 105° C. for 24 hours. Then, 31 parts of tetrahydrophthalic anhydride and 68 parts of carbitol acetate were added to the first mixture to obtain a second mixture. The second mixture was held at 100° C. for 3 hours to obtain a 50% photosensitive prepolymer solution (P-9), which corresponds to a solution of the photosensitive prepolymer (B4). The weight-average molecular weight and the acid value of the prepolymer solution (P-9) are 18000 and 67 mgKOH/g, respectively.

EXAMPLES 1 to 28

Each of the photosensitive resin compositions of Examples 1 to 28 was produced according to the following method. That is, a mixture prepared according to compounding amounts listed in Tables 1 to 3 was sufficiently agitated and dispersed by use of a homomixer. Then, an organic-solvent component was removed from the mixture at a reduced atmosphere, to thereby obtain the photosensitive resin composition of the present invention.

EXAMPLES 29 to 40

Each of the photosensitive resin compositions of Examples 29 to 40 was produced according to the following method. That is, a mixture prepared according to compounding amounts listed in Tables 3 and 4 was sufficiently agitated and dispersed by use of a homomixer, to thereby obtain the photosensitive resin composition of the present invention.

COMPARATIVE EXAMPLES 1 to 3

Each of photosensitive resin compositions of Comparative Examples 1 to 3 was produced by sufficiently kneading a mixture prepared according to compounding amounts listed in Table 4 by use of three rolls.

In Tables 1 to 4, "YX-4000" is an epoxy compound having the epoxy equivalent of 195 manufactured by Yuka Shell Epoxy Kabushiki Kaisha. "EPICLON N-680" is a cresol novolac-type epoxy resin having the epoxy equivalent of 214 manufactured by DAINIPPON INK AND CHEMICALS INCORPORATED. "IRGACURE 907" is a photopolymerization initiator manufactured by CIBA-GEIGY CORPORTATION. "MODAFLOW" is a leveling agent manufactured by MONSANTO COMPANY.

[Performance Evaluations of Resist Ink]

<Applying Step>

A conductive pattern was formed on an FR-4 double-sided copper-clad laminate having a substrate thickness of 1.6 mm and a copper-foil thickness of 35 $\mu$m (manufactured by Sumitomo Bakelite Co., Ltd., "ELC 4762") by etching. Subsequently, each of the photosensitive resin compositions of Examples 1–40 and Comparative Examples 1–3 was applied as a photoresist ink on the entire surface of one side of the double-sided copper-clad laminate by screen printing. The applied film of the photoresist ink was dried at 80° C. for 15 minutes by use of a hot-air dryer, and then cooled to room temperature. As a result, a test substrate having a predried film of a thickness of 20 $\mu$m was obtained. The above procedure was repeated for the other side of the double-sided copper-clad laminate. Therefore, the test substrate has the predried films of the thickness of 20 $\mu$m on the both sides thereof.

<Exposing/Developing Step>

Surface Tackiness of Predried Film

Next, a pair of masks each having a required pattern were directly put on the predried films, and brought into intimate contact with the predried films under a reduced pressure. Then, 150 mJ/cm$^2$ of ultraviolet was irradiated to the test substrate through the masks. After this exposing step, the surface tackiness of the predried film was evaluated by removing the mask from the predried film. In Tables 5 to 8, the symbol "⊙" designates that the mask could be readily removed from the predried film without leaving any contact mark on the predried film. The symbol "○" designates that the mark could be removed from the predried film, but the contact mark was slightly observed on the predried film.

Developing Property

The developing property of the predried film was evaluated under the following conditions (i) and (ii).

(i) After the exposing step, the predried film was developed by spraying a 1 wt % sodium carbonate aqueous solution thereto at 30° C. at a spray pressure of 1.5 Kg/cm$^2$ for 1 minute, and removing a non-exposed portion of the predried film.

(ii) After the exposing step, the predried film was developed by spraying water thereto at 30° C. at a spray pressure of 1.5 Kg/cm² for 3 minutes, and removing a non-exposed portion of the predried film.

In Tables 5 to 8, the symbol "⊚" designates that the non-exposed portion of the predried film was completely removed. The symbol "○" designates that most of the non-exposed portion of the predried film was removed, but a part of the non-exposed portion remained at a boundary between the non-exposed portion and the exposed portion. The symbol "X" designates that the non-exposed portion could be not removed.

<Post-baking Step>

After the developing step, the test substrate with a pattern of the exposed portion of the predried film was dried at 150° C. for 30 minutes by use of a hot-air dryer, to thereby obtain a printed wiring board with the pattern of the dried and cured film, i.e., the solder resist pattern.

[Performance Evaluations of Printed Wiring Board]

Resolution

The mask used has a plurality of slits formed in concentric circles. The slit width and a width between the adjacent slits are 40 μm. A state of the solder resist pattern obtained was observed to evaluate the resolution. Results are shown in Tables 5 to 8. In these Tables, the symbol "⊚" designates that the solder resist pattern has a sharp outline. The symbol "○" designates that the solder resist pattern could be obtained, but a part of the solder resist pattern became chipped.

Solder Resistance

A water-soluble flux "LONCO 3355-11" (manufactured by London Chemical Co., Ltd.) was applied on the printed wiring board as a test piece. The test piece was dipped in a molten solder bath at 260° C. for 15 seconds, and then washed by water. After this procedure was repeated three times, the degree of discoloration to white was observed to evaluate the solder resistance. Results are shown in Tables 5 to 8. In these Tables, the symbol "⊚" designates that there is no discoloration to white.

In addition, a crosscut test was performed according to JIS (Japan Industrial Standard) D 0202 by use of a cellophane adhesive tape. Results of the adhesion test are also shown in Tables 5 to 8. In these Tables, the symbol "⊚" designates that there is no peeling of the solder resist at the crosscut portion.

Film Hardness of Pencil Lead

A hardness of the solder resist was measured by use of a pencil "Mitsubishi Hi-Uui" (manufactured by MITSUBISHI PENCIL Co., Ltd.) according to JIS K 5400. Results are shown in Tables 5 to 8.

Solvent Resistance

After the printed wiring board as the test piece was dipped in isopropyl alcohol and 1,1,1-trichloroethane at room temperature for 1 hour, it was observed to evaluate the solvent resistance. Results are shown in Tables 5 to 8. In these Tables, the symbol "⊚" designates that there is no change.

Acid Resistance

After the printed wiring board as the test piece was dipped in a 10 wt % hydrochloric acid aqueous solution at room temperature for 1 hour, it was observed to evaluate the acid resistance. Results are shown in Tables 5 to 8. In these Tables, the symbol "⊚" designates that there is no change.

Electrochemical Corrosion Resistance

With respect to Examples 1 to 40 and Comparative Examples 1 to 3, specimens for evaluating the electrical corrosion resistance were prepared according to substantially same steps as the above-explained steps by use of a spit-type electrode B of IPC B-25. A bias voltage of DC 100 V was loaded to the spit-type electrode. Whether migration occurs after the elapse of 500 hours under the condition of 40° C. and 90% R.H. was confirmed. Results are shown in Tables 5 to 8. In these Tables, the symbol "⊚" designates that there is no migration.

As understood from Tables 5 to 8, the photosensitive resin compositions of the Comparative Examples 1 to 3, which are oil-based photosensitive resin compositions not containing the photosensitive resin (A), can be developed with the diluted alkali aqueous solution, but can not be developed with water. On the contrary, the photosensitive resin compositions of the Examples 1 to 40 can be developed with water as well as the diluted alkali aqueous solution. In addition, with respect to the surface tackiness of the predried film, the photosensitive resin compositions of Examples 1 to 40 are better than those of Comparative Examples 1 to 3. With respect to the resolution, pencil hardness, solder resistance, solvent resistance, acid resistance, and the electrochemical corrosion resistance, the photosensitive resin compositions of Examples 1 to 40 are substantially equal to or better than those of Comparative Examples 1 to 3.

From these results, the photosensitive resin composition of the present invention will be preferably used as a photoresist ink for manufacturing printed wiring boards such as a solder resist ink and a marking ink, developable-type ink for manufacturing color-filter pixels, or an ink for manufacturing color-filter protective films.

TABLE 1

| Component | Unit: parts by weight | Example | | | | | | | | | | |
|---|---|---|---|---|---|---|---|---|---|---|---|---|
| | | 1 | 2 | 3 | 4 | 5 | 6 | 7 | 8 | 9 | 10 | 11 |
| (A) | (S-1) | 350 | 350 | 350 | 350 | 350 | 350 | — | — | — | — | — |
| | (S-2) | — | — | — | — | — | — | 350 | 350 | 350 | 350 | 350 |
| | (S-3) | — | — | — | — | — | — | — | — | — | — | — |
| | (S-4) | — | — | — | — | — | — | — | — | — | — | — |
| (B) | 65% prepolymer solution (P-1) | 370 | — | — | — | — | — | 370 | — | — | — | — |
| | 57% prepolymer solution (P-2) | — | 420 | — | — | — | — | — | 420 | — | — | — |
| | 50% prepolymer solution (P-3) | — | — | 480 | — | — | — | — | — | 480 | — | — |
| | 50% prepolymer solution (P-4) | — | — | — | 480 | — | — | — | — | — | 480 | — |
| | 35% prepolymer solution (P-5) | — | — | — | — | 685 | — | — | — | — | — | 685 |
| | 35% prepolymer solution (P-6) | — | — | — | — | — | 685 | — | — | — | — | — |
| | 65% prepolymer solution (P-7) | — | — | — | — | — | — | — | — | — | — | — |
| | 57% prepolymer solution (P-8) | — | — | — | — | — | — | — | — | — | — | — |
| | 50% prepolymer solution (P-9) | — | — | — | — | — | — | — | — | — | — | — |

TABLE 1-continued

| Component | Unit: parts by weight | Example | | | | | | | | | | |
|---|---|---|---|---|---|---|---|---|---|---|---|---|
| | | 1 | 2 | 3 | 4 | 5 | 6 | 7 | 8 | 9 | 10 | 11 |
| (C) | YX 4000 | 80 | 80 | — | — | — | — | 80 | 80 | — | — | — |
| | EPICLON N-680 | — | — | 100 | 100 | 100 | 100 | — | — | 100 | 100 | 100 |
| (D) | IRGACURE 907 | 36 | 36 | 36 | 36 | 36 | 36 | 36 | 36 | 36 | 36 | 36 |
| | 2,4-diisopropyl thioxanthone | 4 | 4 | 4 | 4 | 4 | 4 | 4 | 4 | 4 | 4 | 4 |
| (E) | Water | 272 | 272 | 272 | 272 | 272 | 272 | 272 | 272 | 272 | 272 | 272 |
| (F) | Dipentaerythritol hexacrylate | 42 | 42 | 42 | 42 | 42 | 42 | 42 | 42 | 42 | 42 | 42 |
| Pigment | Silica (Average Grain Size: 1 μm) | 84 | 84 | 84 | 84 | 84 | 84 | 84 | 84 | 84 | 84 | 84 |
| | Barium sulfate | 126 | 126 | 126 | 126 | 126 | 126 | 126 | 126 | 126 | 126 | 126 |
| | Phthalocyanine green | 4 | 4 | 4 | 4 | 4 | 4 | 4 | 4 | 4 | 4 | 4 |
| Organic solvent | Carbitol acetate | | | | | | | | | | | |
| Additive | MODAFLOW | | | | | | | | | | | |
| Epoxy hardener | Melamine | 8 | 8 | 8 | 8 | 8 | 8 | 8 | 8 | 8 | 8 | 8 |

TABLE 2

| Component | Unit: parts by weight | Example | | | | | | | | | | |
|---|---|---|---|---|---|---|---|---|---|---|---|---|
| | | 12 | 13 | 14 | 15 | 16 | 17 | 18 | 19 | 20 | 21 | 22 |
| (A) | (S-1) | — | — | — | — | — | — | — | — | — | — | — |
| | (S-2) | 350 | — | — | — | — | — | — | — | — | — | — |
| | (S-3) | — | 250 | 250 | 250 | 250 | 250 | 250 | — | — | — | — |
| | (S-4) | — | — | — | — | — | — | — | 230 | 230 | 230 | 230 |
| (B) | 65% prepolymer solution (P-1) | — | 370 | — | — | — | — | — | 370 | — | — | — |
| | 57% prepolymer solution (P-2) | — | — | 420 | — | — | — | — | — | 420 | — | — |
| | 50% prepolymer solution (P-3) | — | — | — | 480 | — | — | — | — | — | 480 | — |
| | 50% prepolymer solution (P-4) | — | — | — | — | 480 | — | — | — | — | — | 480 |
| | 35% prepolymer solution (P-5) | — | — | — | — | — | 685 | — | — | — | — | — |
| | 35% prepolymer solution (P-6) | 685 | — | — | — | — | — | 685 | — | — | — | — |
| | 65% prepolymer solution (P-7) | — | — | — | — | — | — | — | — | — | — | — |
| | 57% prepolymer solution (P-8) | — | — | — | — | — | — | — | — | — | — | — |
| | 50% prepolymer solution (P-9) | — | — | — | — | — | — | — | — | — | — | — |
| (C) | YX 4000 | — | 80 | 80 | — | — | — | — | 80 | 80 | — | — |
| | EPICLON N-680 | 100 | — | — | 100 | 100 | 100 | 100 | — | — | 100 | 100 |
| (D) | IRGACURE 907 | 36 | 36 | 36 | 36 | 36 | 36 | 36 | 36 | 36 | 36 | 36 |
| | 2,4-diisopropyl thioxanthone | 4 | 4 | 4 | 4 | 4 | 4 | 4 | 4 | 4 | 4 | 4 |
| (E) | Water | 272 | 372 | 372 | 372 | 372 | 372 | 372 | 390 | 390 | 390 | 390 |
| (F) | Dipentaerythritol hexacrylate | 42 | 42 | 42 | 42 | 42 | 42 | 42 | 42 | 42 | 42 | 42 |
| Pigment | Silica (Average Grain Size: 1 μm) | 84 | 84 | 84 | 84 | 84 | 84 | 84 | 84 | 84 | 84 | 84 |
| | Barium sulfate | 126 | 126 | 126 | 126 | 126 | 126 | 126 | 126 | 126 | 126 | 126 |
| | Phthalocyanine green | 4 | 4 | 4 | 4 | 4 | 4 | 4 | 4 | 4 | 4 | 4 |
| Organic solvent | Carbitol acetate | | | | | | | | | | | |
| Additive | MODAFLOW | | | | | | | | | | | |
| Epoxy hardener | Melamine | 8 | 8 | 8 | 8 | 8 | 8 | 8 | 8 | 8 | 8 | 8 |

TABLE 3

| Component | Unit: parts by weight | Example | | | | | | | | | | |
|---|---|---|---|---|---|---|---|---|---|---|---|---|
| | | 23 | 24 | 25 | 26 | 27 | 28 | 29 | 30 | 31 | 32 | 33 |
| (A) | (S-1) | — | — | 350 | — | — | — | 350 | 350 | 350 | — | — |
| | (S-2) | — | — | — | 350 | — | — | — | — | — | 350 | 350 |
| | (S-3) | — | — | — | — | 250 | — | — | — | — | — | — |
| | (S-4) | 230 | 230 | — | — | — | 230 | — | — | — | — | — |
| (B) | 65% prepolymer solution (P-1) | — | — | 435 | — | — | — | — | — | — | — | — |
| | 57% prepolymer solution (P-2) | — | — | — | 490 | — | — | — | — | — | — | — |
| | 50% prepolymer solution (P-3) | — | — | — | — | 560 | — | — | — | — | — | — |
| | 50% prepolymer solution (P-4) | — | — | — | — | — | 560 | — | — | — | — | — |
| | 35% prepolymer solution (P-5) | 685 | — | — | — | — | — | — | — | — | — | — |
| | 35% prepolymer solution (P-6) | — | 685 | — | — | — | — | — | — | — | — | — |
| | 65% prepolymer solution (P-7) | — | — | — | — | — | — | 370 | — | — | 370 | — |
| | 57% prepolymer solution (P-8) | — | — | — | — | — | — | — | 420 | — | — | 420 |
| | 50% prepolymer solution (P-9) | — | — | — | — | — | — | — | — | 480 | — | — |
| (C) | YX 4000 | — | — | 80 | 80 | — | — | 80 | 80 | — | 80 | 80 |
| | EPICLON N-680 | 100 | 100 | — | — | 100 | 100 | — | — | 100 | — | — |
| (D) | IRGACURE 907 | 36 | 36 | 36 | 36 | 36 | 36 | 36 | 36 | 36 | 36 | 36 |
| | 2,4-diisopropyl thioxanthone | 4 | 4 | 4 | 4 | 4 | 4 | 4 | 4 | 4 | 4 | 4 |
| (E) | Water | 390 | 390 | 272 | 272 | 372 | 390 | 140 | 90 | 30 | 140 | 90 |
| (F) | Dipentaerythritol hexacrylate | 42 | 42 | — | — | — | 42 | 42 | 42 | 42 | 42 | 42 |

TABLE 3-continued

| Component | Unit: parts by weight | Example |||||||||||
|---|---|---|---|---|---|---|---|---|---|---|---|
| | | 23 | 24 | 25 | 26 | 27 | 28 | 29 | 30 | 31 | 32 | 33 |
| Pigment | Silica (Average Grain Size: 1 μm) | 84 | 84 | 84 | 84 | 84 | 84 | 84 | 84 | 84 | 84 | 84 |
| | Barium sulfate | 126 | 126 | 126 | 126 | 126 | 126 | 126 | 126 | 126 | 126 | 126 |
| | Phthalocyanine green | 4 | 4 | 4 | 4 | 4 | 4 | 4 | 4 | 4 | 4 | 4 |
| Organic solvent | Carbitol acetate | | | | | | | | | | | |
| Additive | MODAFLOW | | | | | | | | | | | |
| Epoxy hardener | Melamine | 8 | 8 | 8 | 8 | 8 | 8 | 8 | 8 | 8 | 8 | 8 |

TABLE 4

| Component | Unit: parts by weight | Example ||||||| Comparative Example |||
|---|---|---|---|---|---|---|---|---|---|---|---|
| | | 34 | 35 | 36 | 37 | 38 | 39 | 40 | 1 | 2 | 3 |
| (A) | (S-1) | — | — | — | — | — | — | — | — | — | — |
| | (S-2) | 350 | — | — | — | — | — | — | — | — | — |
| | (S-3) | — | 250 | 250 | 250 | — | — | — | — | — | — |
| | (S-4) | — | — | — | — | 230 | 230 | 230 | — | — | — |
| (B) | 65% prepolymer solution (P-1) | — | — | — | — | — | — | — | — | — | — |
| | 57% prepolymer solution (P-2) | — | — | — | — | — | — | — | — | — | — |
| | 50% prepolymer solution (P-3) | — | — | — | — | — | — | — | — | — | — |
| | 50% prepolymer solution (P-4) | — | — | — | — | — | — | — | — | — | — |
| | 35% prepolymer solution (P-5) | — | — | — | — | — | — | — | — | — | — |
| | 35% prepolymer solution (P-6) | — | — | — | — | — | — | — | — | — | — |
| | 65% prepolymer solution (P-7) | — | 370 | — | — | 370 | — | — | 430 | — | — |
| | 57% prepolymer solution (P-8) | — | — | 420 | — | — | 420 | — | — | 480 | — |
| | 50% prepolymer solution (P-9) | 480 | — | — | 480 | — | — | 480 | — | — | 560 |
| (C) | YX 4000 | — | 80 | 80 | — | 80 | 80 | — | 80 | 100 | — |
| | EPICLON N-680 | 100 | — | — | 100 | — | — | 100 | — | — | 100 |
| (D) | IRGACURE 907 | 36 | 36 | 36 | 36 | 36 | 36 | 36 | 36 | 36 | 36 |
| | 2,4-diisopropyl thioxanthone | 4 | 4 | 4 | 4 | 4 | 4 | 4 | 4 | 4 | 4 |
| (E) | Water | 30 | 240 | 190 | 130 | 260 | 210 | 150 | — | — | — |
| (F) | Dipentaerythritol hexacrylate | 42 | 42 | 42 | 42 | 42 | 42 | 42 | 42 | 42 | 42 |
| Pigment | Silica (Average Grain Size: 1 μm) | 84 | 84 | 84 | 84 | 84 | 84 | 84 | 84 | 84 | 84 |
| | Barium sulfate | 126 | 126 | 126 | 126 | 126 | 126 | 126 | 126 | 126 | 126 |
| | Phthalocyanine green | 4 | 4 | 4 | 4 | 4 | 4 | 4 | 4 | 4 | 4 |
| Organic solvent | Carbitol acetate | — | — | — | — | — | — | — | 129 | 88 | 16 |
| Additive | MODAFLOW | — | — | — | — | — | — | — | 8 | 8 | 8 |
| Epoxy hardener | Melamine | 8 | 8 | 8 | 8 | 8 | 8 | 8 | 8 | 8 | 8 |

TABLE 5

| | | 1 | 2 | 3 | 4 | 5 | 6 | 7 | 8 | 9 | 10 | 11 |
|---|---|---|---|---|---|---|---|---|---|---|---|---|
| Exposing/ Developing Step Properties of Printed Wiring Board | Surface Tackiness of Predried Film | ◎ | ◎ | ◎ | ◎ | ◎ | ◎ | ◎ | ◎ | ◎ | ◎ | ◎ |
| | Developing Property (i) | ◎ | ◎ | ◎ | ◎ | ◎ | ◎ | ◎ | ◎ | ◎ | ◎ | ◎ |
| | Developing Property (ii) | ◎ | ◎ | ◎ | ◎ | ◎ | ◎ | ◎ | ◎ | ◎ | ◎ | ◎ |
| | Resolution | ◎ | ◎ | ◎ | ◎ | ◎ | ◎ | ◎ | ◎ | ◎ | ◎ | ◎ |
| | Solder Resistance — Discoloration to white | ◎ | ◎ | ◎ | ◎ | ◎ | ◎ | ◎ | ◎ | ◎ | ◎ | ◎ |
| | Solder Resistance — Adhesion | ◎ | ◎ | ◎ | ◎ | ◎ | ◎ | ◎ | ◎ | ◎ | ◎ | ◎ |
| | Pencil Hardness | 5H | 5H | 6H | 6H | 7H | 7H | 5H | 5H | 6H | 6H | 7H |
| | Solvent Resistance | ◎ | ◎ | ◎ | ◎ | ◎ | ◎ | ◎ | ◎ | ◎ | ◎ | ◎ |
| | Acid Resistance | ◎ | ◎ | ◎ | ◎ | ◎ | ◎ | ◎ | ◎ | ◎ | ◎ | ◎ |
| | Electrochemical Corrosion Resistance | ◎ | ◎ | ◎ | ◎ | ◎ | ◎ | ◎ | ◎ | ◎ | ◎ | ◎ |

TABLE 6

| | | Example |||||||||||
|---|---|---|---|---|---|---|---|---|---|---|---|---|
| | | 12 | 13 | 14 | 15 | 16 | 17 | 18 | 19 | 20 | 21 | 22 |
| Exposing/ Developing Step Properties of Printed Wiring | Surface Tackiness of Predried Film | ◎ | ◎ | ◎ | ◎ | ◎ | ◎ | ◎ | ◎ | ◎ | ◎ | ◎ |
| | Developing Property (i) | ◎ | ◎ | ◎ | ◎ | ◎ | ◎ | ◎ | ◎ | ◎ | ◎ | ◎ |
| | Developing Property (ii) | ◎ | ◎ | ◎ | ◎ | ◎ | ◎ | ◎ | ◎ | ◎ | ◎ | ◎ |
| | Resolution | ◎ | ◎ | ◎ | ◎ | ◎ | ◎ | ◎ | ◎ | ◎ | ◎ | ◎ |
| | Solder Resistance — Discoloration to white | ◎ | ◎ | ◎ | ◎ | ◎ | ◎ | ◎ | ◎ | ◎ | ◎ | ◎ |
| | Solder Resistance — Adhesion | ◎ | ◎ | ◎ | ◎ | ◎ | ◎ | ◎ | ◎ | ◎ | ◎ | ◎ |

TABLE 6-continued

| | | Example | | | | | | | | | | |
|---|---|---|---|---|---|---|---|---|---|---|---|---|
| | | 12 | 13 | 14 | 15 | 16 | 17 | 18 | 19 | 20 | 21 | 22 |
| Board | Pencil Hardness | 7H | 5H | 5H | 6H | 6H | 7H | 7H | 5H | 5H | 6H | 6H |
| | Solvent Resistance | ◎ | ◎ | ◎ | ◎ | ◎ | ◎ | ◎ | ◎ | ◎ | ◎ | ◎ |
| | Acid Resistance | ◎ | ◎ | ◎ | ◎ | ◎ | ◎ | ◎ | ◎ | ◎ | ◎ | ◎ |
| | Electrochemical Corrosion Resistance | ◎ | ◎ | ◎ | ◎ | ◎ | ◎ | ◎ | ◎ | ◎ | ◎ | ◎ |

TABLE 7

| | | Example | | | | | | | | | | |
|---|---|---|---|---|---|---|---|---|---|---|---|---|
| | | 23 | 24 | 25 | 26 | 27 | 28 | 29 | 30 | 31 | 32 | 33 |
| Exposing/ | Surface Tackiness of Predried Film | ◎ | ◎ | ◎ | ◎ | ◎ | ◎ | ◎ | ◎ | ◎ | ◎ | ◎ |
| Developing | Developing Property (i) | ◎ | ◎ | ◎ | ◎ | ◎ | ◎ | ◎ | ◎ | ◎ | ◎ | ◎ |
| Step | Developing Property (ii) | ◎ | ◎ | ◎ | ◎ | ◎ | ◎ | ◎ | ◎ | ◎ | ◎ | ◎ |
| Properties | Resolution | ◎ | ◎ | ○ | ○ | ○ | ○ | ◎ | ◎ | ◎ | ◎ | ◎ |
| of Printed | Solder  Discoloration to white | ◎ | ◎ | ◎ | ◎ | ◎ | ◎ | ◎ | ◎ | ◎ | ◎ | ◎ |
| Wiring | Resistance  Adhesion | ◎ | ◎ | ◎ | ◎ | ◎ | ◎ | ◎ | ◎ | ◎ | ◎ | ◎ |
| Board | Pencil Hardness | 7H | 7H | 5H | 5H | 5H | 5H | 5H | 5H | 6H | 5H | 5H |
| | Solvent Resistance | ◎ | ◎ | ◎ | ◎ | ◎ | ◎ | ◎ | ◎ | ◎ | ◎ | ◎ |
| | Acid Resistance | ◎ | ◎ | ◎ | ◎ | ◎ | ◎ | ◎ | ◎ | ◎ | ◎ | ◎ |
| | Electrochemical Corrosion Resistance | ◎ | ◎ | ◎ | ◎ | ◎ | ◎ | ◎ | ◎ | ◎ | ◎ | ◎ |

TABLE 8

| | | Example | | | | | | | Comparative Example | | |
|---|---|---|---|---|---|---|---|---|---|---|---|
| | | 34 | 35 | 36 | 37 | 38 | 39 | 40 | 1 | 2 | 3 |
| Exposing/ | Surface Tackiness of Predried Film | ◎ | ◎ | ◎ | ◎ | ◎ | ◎ | ◎ | ○ | ○ | ○ |
| Developing | Developing Property (i) | ◎ | ◎ | ◎ | ◎ | ◎ | ◎ | ◎ | ◎ | ○ | ◎ |
| Step | Developing Property (ii) | ◎ | ◎ | ◎ | ◎ | ◎ | ◎ | ◎ | x | x | x |
| Properties | Resolution | ◎ | ◎ | ◎ | ◎ | ◎ | ◎ | ◎ | ○ | ○ | ○ |
| of Printed | Solder  Discoloration to white | ◎ | ◎ | ◎ | ◎ | ◎ | ◎ | ◎ | ◎ | ◎ | ◎ |
| Wiring | Resistance  Adhesion | ◎ | ◎ | ◎ | ◎ | ◎ | ◎ | ◎ | ◎ | ◎ | ◎ |
| Board | Pencil Hardness | 6H | 5H | 5H | 6H | 5H | 5H | 6H | 5H | 5H | 5H |
| | Solvent Resistance | ◎ | ◎ | ◎ | ◎ | ◎ | ◎ | ◎ | ◎ | ◎ | ◎ |
| | Acid Resistance | ◎ | ◎ | ◎ | ◎ | ◎ | ◎ | ◎ | ◎ | ◎ | ◎ |
| | Electrochemical Corrosion Resistance | ◎ | ◎ | ◎ | ◎ | ◎ | ◎ | ◎ | ◎ | ◎ | ◎ |

What is claimed is:

1. A photosensitive resin composition including:
   (A) a water-soluble photosensitive resin selected from the group consisting of a first resin obtained by introducing a styryl pyridinium group into a polyvinyl alcohol polymer, a second resin obtained by introducing a styryl quinolinium group into the polyvinyl alcohol polymer, and a third resin obtained by adding N-alkylol (meth) acrylamide to the polyvinyl alcohol polymer;
   (B) a photosensitive prepolymer having carboxyl group and at least two ethylenically unsaturated groups in molecule;
   (C) an epoxy compound having at least two epoxy groups in one molecule;
   (D) a photopolymerization initiator; and
   (E) water.

2. The photosensitive resin composition as set forth in claim 1, further including (F) a photopolymerizable ethylenically-unsaturated monomer.

3. A photoresist ink for manufacturing printed wiring boards, which is made of the photosensitive resin composition as set forth in claim 2.

4. A predried film obtained by drying the photoresist ink as set forth in claim 3.

5. A film of the photoresist ink as set forth in claim 3 formed on a substrate.

6. A method of manufacturing a printed circuit board comprising the steps of:
   applying the photoresist ink composition as set forth in claim 3 on a substrate to obtain an applied film;
   predrying the applied film to obtain a predried film;
   irradiating ultraviolet to the predried film through a mask having a required pattern;
   developing the predried film after the irradiation step of ultraviolet; and
   performing a post-baking treatment to the predried film after the developing step.

7. A predried film obtained by drying the photosensitive resin composition as set forth in claim 2.

8. A film of the photosensitive resin composition as set forth in claim 2 formed on a substrate.

9. A method of manufacturing a printed circuit board comprising the steps of:

applying the photosensitive resin composition as set forth in claim 2 on a substrate to obtain an applied film;

predrying the applied film to obtain a predried film;

irradiating ultraviolet to the predried film through a mask having a required pattern;

developing the predried film after the irradiation step of ultraviolet; and performing a post-baking treatment to the predried film after the developing step.

10. A photoresist ink for manufacturing printed wiring boards, which is made of the photosensitive resin composition as set forth in claim 1.

11. A predried film obtained by drying the photoresist ink as set forth in claim 10.

12. A film of the photoresist ink as set forth in claim 10 formed on a substrate.

13. A method of manufacturing a printed circuit board comprising the steps of:

applying the photoresist ink as set forth in claim 10 on a substrate to obtain an applied film;

predrying the applied film to obtain a predried film;

irradiating ultraviolet to the predried film through a mask having a required pattern;

developing the predried film after the irradiation step of ultraviolet; and performing a post-baking treatment to the predried film after the developing step.

14. A predried film obtained by drying the photosensitive resin composition as set forth in claim 1.

15. A film of the photosensitive resin composition as set forth in claim 1 formed on a substrate.

16. A method of manufacturing a printed circuit board comprising the steps of:

applying the photosensitive resin composition as set forth in claim 1 on a substrate to obtain an applied film;

predrying the applied film to obtain a predried film;

irradiating ultraviolet to the predried film through a mask having a required pattern;

developing the predried film after the irradiation step of ultraviolet; and performing a post-baking treatment to the predried film after the developing step.

\* \* \* \* \*